United States Patent [19]
Iwatani

[11] 4,392,151
[45] Jul. 5, 1983

[54] SEMICONDUCTOR DEVICE

[75] Inventor: Shiro Iwatani, Himeji, Japan

[73] Assignee: Mitsubishi Denki Kabushiki Kaisha, Tokyo, Japan

[21] Appl. No.: 182,404

[22] Filed: Aug. 26, 1980

[30] Foreign Application Priority Data

Aug. 29, 1979 [JP] Japan .......................... 54-119769[U]

[51] Int. Cl.³ ...................... H01L 23/30; H01L 23/36
[52] U.S. Cl. ..................................... 357/72; 357/70; 357/74; 357/81
[58] Field of Search ..................... 357/72, 74, 70, 81

[56] References Cited

U.S. PATENT DOCUMENTS

| | | |
|---|---|---|
| 3,763,403 | 10/1973 | Lootens . |
| 3,820,153 | 6/1974 | Quinn ................................... 357/81 |
| 3,870,944 | 3/1975 | Ogawa et al. . |
| 3,920,114 | 12/1975 | Hodge ................................... 357/72 |
| 3,984,739 | 10/1976 | Mochizuki et al. ................... 357/72 |
| 4,107,727 | 8/1978 | Ikezawa et al. ....................... 357/72 |
| 4,128,801 | 12/1978 | Gansert et al. . |
| 4,330,790 | 5/1982 | Burns .................................... 357/72 |

Primary Examiner—William D. Larkins
Attorney, Agent, or Firm—Wenderoth, Lind & Ponack

[57] ABSTRACT

A semiconductor element is disposed in a recess at the bottom of a flanged metallic casing through a solder layer. An electrically insulating, molded plate is fixed to the casing by having protrusions fitted into holes disposed in opposite flanges of the casing and also two opposite L-shaped members abutting against adjacent lateral walls of the casing. Six strip-shaped leads buried in and extended from the molded plate are arranged to be soldered at first ends to associated solder electrodes on the exposed surface of the semiconductor element. The element and L-shaped members are burried in a resinous material molded within the casing.

2 Claims, 4 Drawing Figures

SEMICONDUCTOR DEVICE

BACKGROUND OF THE INVENTION

This invention relates to improvements in a semiconductor device, and more particularly to a structure of a semiconductor device in which a plurality of external connection electrodes of a semiconductor element involved can led to easily handled external terminals.

Conventional semiconductor devices of the type referred to have comprised a semiconductor element including a plurality of solder electrodes for external connection, a metallic base plate for carrying the semiconductor element, a plurality of rod-shaped external terminals extended and sealed through the base plate around the semiconductor element, one for each solder electrode. The external terminals are electrically insulated from the base plate through glass seals and are connected through strip-shaped leads to the associated solder electrodes by soldering. A metallic cap is welded to the base plate to protect the semiconductor element against the atmosphere.

In conventional semiconductor devices such as described above, the use of the glass seal has rendered the base plate expensive and soldering has been effected at many positions, resulting in a decrease in reliability of the product. Also the strip-shaped leads inevitably have been positioned on the associated solder electrodes by hand labor resulting in an increase in assembling expense. In addition, a welder has been required to weld the protective cap to the base plate. This has meant that the assembling equipment involved has been large-scaled.

Accordingly it is an object of the present invention to provide a new and improved encapsulated semiconductor device including a semiconductor element provided on a surface thereof with a plurality of solder electrodes led to the exterior of the device through strip-shaped leads which serve also as external terminals, thereby to decrease the number of soldering connections required and to increase reliability of the device.

It is another object of the present invention to provide a new and improved encapsulated semiconductor device which easily may be automatically assembled by constructing a metallic casing for a semiconductor element and an electrically insulating plate disposed on the casing so that a plurality of solder electrodes on a semiconductor element involved are simultaneously overlaid with adjacent ends of associated strip-shaped leads serving to connect the solder electrodes to external devices merely by fitting the electrically insulating plate into the metallic casing.

It is still another object of the present invention to provide a new encapsulated semiconductor device wherein the solder is significantly improved by constructing a metallic casing, for a semiconductor element involved and an electrically insulating plate disposed on the metallic casing so that the semiconductor element is positioned in the metallic casing and the electrically insulating plate positions the metallic casing thereby to permit associated components to be connected to one another without positional deviations.

SUMMARY OF THE INVENTION

The present invention provides a semiconductor element including a pair of opposite main surfaces, a plurality of solder electrodes for external connection disposed on the semiconductor element, one of the solder electrodes being disposed on one of the main surfaces of the semiconductor element, the remaining solder electrodes being disposed in a predetermined pattern on the other main surface of the semiconductor element. A metallic casing includes a positioning recess and female fitting means and forms a heat sink, and the semiconductor element is disposed in the positioning recess. A plurality of resilient strip-shaped leads are connected at first ends thereof to respective of the solder electrodes. An electrically insulating plate is formed by molding a heat resisting, electrically insulating resinous material so that the plate includes male fitting means capable of being fitted into the female fitting means of the metallic casing, and the remaining portions of the strip-shaped leads are buried therein except for second end portions extending externally thereof. An amount of a resinous material is molded within the metallic casing to encapsulate the semiconductor element with the casing, the arrangement being such that the male fitting means on the electrically insulating plate are fitted into the female fitting means in the metallic casing, thereby to fix the electrically insulating plate to the metallic casing and cause the strip-shaped leads to hold resiliently the semiconductor element within the positioning recess on the metallic casing, following by soldering of the solder electrodes to the metallic casing and the strip-shaped leads.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENT

Figure 1:
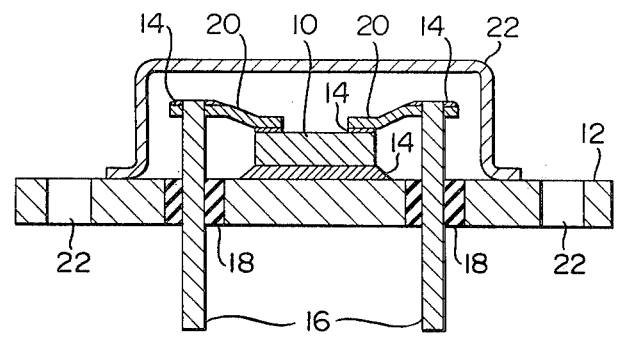
FIG. 1 is a sectional view of a conventional encapsulated semiconductor device.
Figure 2:
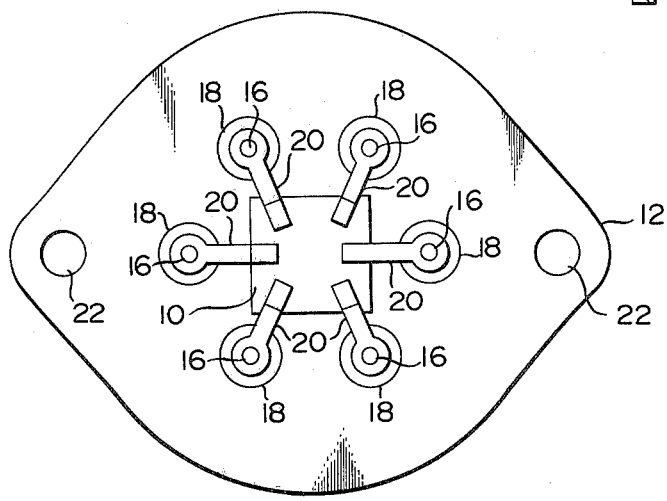
FIG. 2 is a plan view of the arrangement shown in FIG. 1 with the protective cap as shown in FIG. 1 removed.

Referring now to FIGS. 1 and 2 of the drawings, there is illustrated a hermetically enclosed semiconductor device of the conventional construction with a plurality of solder electrodes for external connection. The arrangement illustrated comprises a square semiconductor element 10 disposed on a metallic base plate or bedplate through one of a plurality of solder electrodes 14. The metallic bedplate 12 serves as a combined heat sink and fitting plate and includes a plurality of holes disposed therein at predetermined equal angular intervals about a circle encircling the semiconductor element 10. The number of holes is equal to that of those solder electrodes 14 located on the upper surface, as viewed in FIG. 1 of the semiconductor element 10 to be similar in pattern to the holes. In the example illustrated six holes extend through the bedplate 12 at equal angular intervals of 60 degrees around the element 10. Then an external terminal 16 in the form of a rod is extended and sealed through each hole by means of glass seal 18 filling that hole. Thus the external terminals 16 are electrically insulated from the bedplate 12.

As seen from FIGS. 1 and 2, each of a plurality of strip-shaped leads 20 includes both ends preliminarily coated with a soldering agent and is fixedly secured at one end to an associated one of the solder electrodes 14 on the upper surface of the semiconductor element and at the other end to a mating one of the external terminals 16 through a solder layer also designated by the reference numeral 14.

Then a protective cap 22 is hermetically secured to the upper surface as viewed in FIG. 1 of the bedplate 12 to enclose hermetically the semiconductor element 10 therein.

The bedplate 12 is provided at either end with a mounting hole 22 for mounting the arrangement shown in FIGS. 1 and 2 to any suitable component (not shown).

The solder electrodes 14 serve to connect the arrangement shown in FIGS. 1 and 2 to an external device or devices and the number of the external terminals 16 and therefore the leads 20 is equal to that of the solder electrodes 14 located on the upper surface of the semiconductor element 10. In this case, that number is six (6).

In order to assemble the arrangement shown in FIGS. 1 and 2, the semiconductor element 10 is put in place on the bedplate 12 having the external terminals 16 extended and sealed therethrough by means of the glass seals 18 fitting the respective holes. Then a hot plate or a furnace is used to solder the semiconductor element 10 to the bedplate 12. Subsequently, the six strip-shaped leads 20 are positioned to connect the solder electrodes 14 on the upper surface of the semiconductor element 10 with respective terminals 16, after which those electrodes 14 and the external terminals 16 are soldered to the mating leads 20 by using a hot plate or a furnace which may be the same as that used to connect the semiconductor element 10 to the bedplate 12. Following this the protective cap 22 is welded to the bedplate 12 in an atmosphere of an inert gas in order to protect the semiconductor element 10 and the strip-shaped leads 20 against the atmosphere.

Conventional semiconductor devices such as shown in FIGS. 1 and 2 have been disadvantageous in that the bedplate 12 is expensive because a glass seal 18 is used to fix each of the external terminals 16 to the bedplate 12 and electrically insulate it from the latter. Also, since the solder electrodes 14 on the upper surface of the semiconductor element 10 are connected to the associated external terminals 16 through strip-shaped leads 20, soldering is required to be effected at both ends of the leads 20, in addition to the soldering of the solder electrode 14 on the lower surface of the element 10 to the bedplate 12. In the example illustrated a total of thirteen soldering connections is required. In other words, the number of connecting positions is relatively great and the reliability of the resulting device accordingly is lowered.

Further the strip-shaped leads 20 have been separately handled so that it has been difficult to position and arrange such leads automatically, and inevitably manual work has been required, resulting in an expensive assembly. In addition, a welder has been required to weld the protective cap 22 to the bedplate 12. Therefore, the equipment used in assembling the semiconductor device has been larged-scaled.

Figure 3:
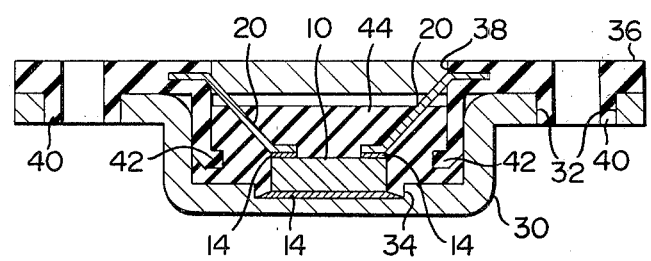
FIG. 3 is a sectional view of one embodiment according to the encapsulated semiconductor device of the present invention.
Figure 4:
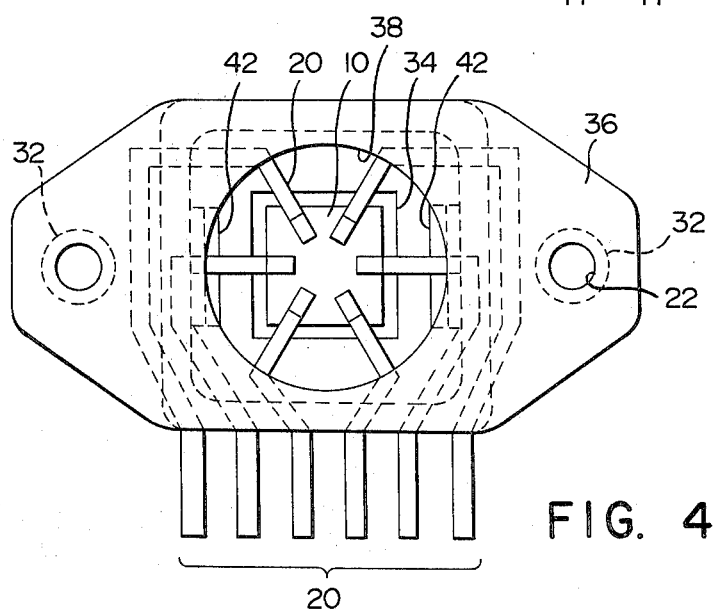
FIG. 4 is a plan view of the arrangement shown in FIG. 3 as viewed from the top thereof before the metallic casing is charged with resinous material as shown in FIG. 3.

Referring now to FIGS. 3 and 4, there is illustrated one embodiment according to the encapsulated semiconductor device of the present invention. The arrangement illustrated comprises a flanged metallic casing 30 of a square cross section including one open side, a pair of tapered flanges extending in opposite directions from opposite edges of the open side, and a pair of fitting holes 32 disposed in end portions of respective of the flanges. The metallic casing 30 serves also as a heat sink and includes at the bottom a shallow recess 34 for positioning a semiconductor element 10.

It is assumed that the semiconductor element 10 is square and includes six solder electrodes for external connection disposed on the upper surface thereof and one solder electrode disposed on the lower surface thereof in the same manner as that shown in FIGS. 1 and 2. As shown best in FIG. 3, the semiconductor element 10 is fixedly located in the positioning recess 34 similar in shape to the same through the lower solder electrode 14.

The flanged casing 30 is overlaid with an electrically insulating plate 36 identical in outer profile to casing 30 and including a central circular opening 38 having a diameter greater than the diagonal of the semiconductor element 10 and pair of protrusions 40 complementary in shape to the fitting holes 32 in the casing 30 and snugly fitted into the latter. Each of the protrusions 40 includes a mounting hole 22 as described above in conjunction with FIGS. 1 and 2 extending centrally therethrough. The electrically insulating plate 36 further includes a pair of L-shaped members 42 dependent from the main plate body so as to be tangent to a circle defining the central opening 38 at those points thereof lying on the longitudinal axis of the plate 36 and to abut against the opposite lateral walls of the casing 30. Each of the L-shaped members 42 terminates at one leg of the "L" directed radially inward and short of the bottom of the casing 30.

As shown best in FIG. 4, six strip-shaped resilient leads extend radially and downward from the peripheral surface of the central opening 38 and at equal angular intervals so that the longitudinal axes thereof pass through the centers of the associated solder electrodes 14 on the upper surface of the semiconductor element 10. The ends of the strip-shaped leads 20 are preliminarily coated with a soldering agent and are bent to be connected to respective of the solder electrodes 14 on the upper surface of the semiconductor element 10. The strip-shaped leads 20 include respective intermediate portions buried in the electrically insulating plate 36 and suitably turned around the central opening 38 therein, and the other end portions of leads 20 are protruded at predetermined equal intervals from the central portion of one side, in this case the lower side as viewed in FIG. 4, of the plate 36.

The electrically insulating plate 36 is prepared by molding a heat resisting, electrically insulating resinous material into a configuration as described above with the strip-shaped leads 20 located at predetermined positions therein by means of an associated mold.

In order to assemble the arrangement shown in FIGS. 3 and 4, the semiconductor element 10 is placed in the positioning recess 34 on the metallic casing 30 with the lower solder electrode 14 put at the bottom of the recess 34. Then the electrically insulating plate 36 with the strip-shaped leads 20 is disposed on the metallic casing 30 by having the protrusions 40 thereof fitted into the fitting holes 32 in the casing 30. At that time, the L-shaped members 42 abut against the adjacent lateral walls of the casing, 30 to fix the plate 36 to the casing and simultaneously the semiconductor element is resiliently carried between the recess 34 at the bottom of the casing 30 and first ends of the strip-shaped leads 20 through the solder electrodes 14 as shown in FIG. 3.

Thereafter a hot plate or a furnace is used to solder simultaneously the solder electrodes 14 on the element 10 to the metallic casing 30 and the first ends of the leads 20.

Subsequently a suitable resinous material 44 is charged into a space defined by the electrically insulating plate 36 and the metallic casing 30 through central opening 38 and is molded in the space to encapsulate the semiconductor element 10 with the metallic casing 30 and simultaneously bury the L-shaped members 42 of the electrically insulating plate 36 therein, resulting in the complete fixing of the electrically insulating plate 36 to the metallic casing 30.

The present invention has several advantages. For instance, the example illustrated includes only seven soldering positions or connections because the solder electrodes on the upper surface of the semiconductor element are led to the exterior of the device through the strip-shaped leads, and those leads also serve as external terminals. Therefore, the number of soldering positions is decreased by about one half compared to the number previously required and the reliability of the unit is increased accordingly. Also since the strip-shaped leads are partially buried in the electrically insulating plate, the six leads can be simultaneously positioned on the associated solder electrodes on the semiconductor element merely by fitting the electrically insulating plate into the metallic casing. Therefore the assembly operation readily can be made automatic to decrease the assembling cost. In addition, the semiconductor element can be positioned in the recess at the bottom of the metallic casing and the electrically insulating plate can be positioned by the L-shaped members thereof so that the protrusions of the plate are readily fitted into the fitting holes in the casing. This means that the strip-shaped leads can be connected to the respective solder electrodes on the upper surface of the semiconductor element, and there will not be any substantial deviation of the positions of the leads from the respective solder electrodes.

Further, the equipment required for the assembly operation is not particularly required to be large-scaled.

From the foregoing it is seen that the present invention provides a semiconductor device excellent in both reliability and workability and which can be manufactured inexpensively. Thus the present invention provides good results with large-sized semiconductor elements such as high power semiconductor elements.

While the present invention has been illustrated and described in conjunction with a single preferred embodiment thereof it is to be understood that numerous changes and modifications may be resorted to without departing from the spirit and scope of the present invention. For example, the present invention has been described in conjunction with six solder electrodes and therefore six strip-shaped leads, but it is to be understood that the present invention is not restricted thereto or thereby and that the same is equally applicable to any desired number other than six of the solder electrodes with an equal number of the strip-shaped leads.

What is claimed is:

1. A semiconductor device comprising:
   a semiconductor element including a pair of opposite main surfaces;
   a plurality of solder electrodes for external connection disposed on said semiconductor element, one of said solder electrodes being disposed on one of said main surfaces of said semiconductor element, the remaining solder electrodes being disposed in a predetermined pattern on the other main surface of said semiconductor element;
   a metallic casing including a positioning recess and female fitting means and forming a heat sink;
   said semiconductor element being disposed in said positioning recess;
   a plurality of resilient strip-shaped leads connected at first ends thereof to respective of said solder electrodes on said other main surface of said semiconductor element;
   an electrically insulating plate formed by molding a heat resisting, electrically insulating resinous material so that said plate includes male fitting means capable of being fitted into said female fitting means in said metallic casing, intermediate portions of said strip-shaped leads being buried in said plate, and second ends of said strip-shaped leads extending externally of said plate; and
   a quantity of a resinous material molded within said metallic casing to encapsulate said semiconductor element with said casing;
   the arrangement being such that said male fitting means on said electrically insulating plate fit into said female fitting means in said metallic casing, thereby to fix said electrically insulating plate to said metallic casing and cause said strip-shaped leads to hold resiliently said semiconductor element in said positioning recess on said metallic casing, followed by soldering of said solder electrodes on said semiconductor element to said metallic casing and said strip-shaped leads.

2. A semiconductor device as claimed in claim 1, wherein said electrically insulating plate further includes at least one L-shaped member extending into said metallic casing, and said L-shaped member is buried in said resinous material molded within said metallic casing, thereby to fix additionally said electrically insulating plate to said metallic casing.

* * * * *